United States Patent
Gulati et al.

(10) Patent No.: US 9,603,109 B2
(45) Date of Patent: Mar. 21, 2017

(54) USING SHORT RANGE DISCOVERY TO PREDICT THE AGC SETTING FOR LONG RANGE DISCOVERY

(71) Applicant: QUALCOMM Incorporated, San Diego, CA (US)

(72) Inventors: Kapil Gulati, Long Branch, NJ (US); Shailesh Patil, North Wales, PA (US); Hua Wang, Basking Ridge, NJ (US); Saurabha Rangrao Tavildar, Jersey City, NJ (US); Pablo Anigstein, Gillette, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 158 days.

(21) Appl. No.: 14/447,239

(22) Filed: Jul. 30, 2014

(65) Prior Publication Data
US 2015/0071114 A1 Mar. 12, 2015

Related U.S. Application Data

(60) Provisional application No. 61/876,597, filed on Sep. 11, 2013.

(51) Int. Cl.
| | |
|---|---|
| *H04L 12/28* | (2006.01) |
| *H04W 52/52* | (2009.01) |
| *H04W 8/00* | (2009.01) |
| *H04W 4/00* | (2009.01) |
| *H04W 48/10* | (2009.01) |
| *H03G 3/30* | (2006.01) |
| *H04B 1/00* | (2006.01) |

(52) U.S. Cl.
CPC .......... *H04W 52/52* (2013.01); *H03G 3/3078* (2013.01); *H04B 1/00* (2013.01); *H04W 4/005* (2013.01); *H04W 8/005* (2013.01); *H04W 48/10* (2013.01)

(58) Field of Classification Search
CPC ..................................................... H04W 52/52
USPC ......................................................... 370/254
See application file for complete search history.

(56) References Cited

U.S. PATENT DOCUMENTS

| | | |
|---|---|---|
| 2003/0157910 A1 | 8/2003 | Bruckmann et al. |
| 2010/0189188 A1 | 7/2010 | Li et al. |

OTHER PUBLICATIONS

IPEA/EPO, Second Written Opinion of the International Preliminary Examining Authority, Int'l. App. No. PCT/US2014/049048, Jul. 20, 2015, European Patent Office, Rijswijk, NL, 5 pgs.
ISA/EPO, International Search Report and Written Opinion of the International Searching Authority, Int'l. App. No. PCT/US2014/049048, Dec. 9, 2014, European Patent Office, Rijswijk, NL 10 pgs.

*Primary Examiner* — Shripal Khajuria
(74) *Attorney, Agent, or Firm* — Holland & Hart LLP

(57) ABSTRACT

Methods, systems, apparatuses, and devices are described for predicting an automatic gain control setting for long range discovery in a peer-to-peer network. In one configuration, an energy of each resource of a first set of resources may be estimated. A total energy of a second set of resources used for long range discovery in the peer-to-peer network may be predicted. The predicted total energy may be based at least in part on the estimated energy of each resource of the first set of resources. An automatic gain control setting for the second set of resources may be predicted based at least in part on the predicted total energy.

25 Claims, 10 Drawing Sheets

USING SHORT RANGE DISCOVERY TO PREDICT THE AGC SETTING FOR LONG RANGE DISCOVERY

CROSS REFERENCES

The present Application for patent claims priority to U.S. Provisional Patent Application No. 61/876,597 by Gulati et al., entitled "Using Short Range Discovery to Predict the AGC Setting for Long Range Discovery," filed Sep. 11, 2013, and assigned to the assignee hereof.

FIELD OF THE DISCLOSURE

The following relates generally to wireless communication, and more specifically to peer discovery in a peer-to-peer network.

DESCRIPTION OF RELATED ART

Wireless communications systems are widely deployed to provide various types of communication content such as voice, video, packet data, messaging, broadcast, and so on. These systems may be multiple-access systems capable of supporting communication with multiple users by sharing the available system resources (e.g., time, frequency, and power). Examples of such multiple-access systems include code-division multiple access (CDMA) systems, time-division multiple access (TDMA) systems, frequency-division multiple access (FDMA) systems, and orthogonal frequency-division multiple access (OFDMA) systems.

Generally, a wireless multiple-access communications system may include a number of base stations, each simultaneously supporting communication for multiple user equipments (UEs). Base stations may communicate with UEs on downstream and upstream links. Each base station has a coverage range, which may be referred to as the coverage area of the cell. In some cases, a UE may communicate directly with its peers in a peer-to-peer network (e.g., not via an access point). In part because the UEs desiring to participate in peer-to-peer communications may be mobile devices, the UEs may periodically engage in a peer discovery process, which may involve broadcasting one or more peer discovery signals by each of the UEs and receiving the peer discovery signals of other UEs.

SUMMARY

The described features generally relate to one or more improved methods, systems, apparatuses, and/or devices for predicting an automatic gain control (AGC) setting for long range discovery in a peer-to-peer network. In some cases, the peer discovery process in which a UE engages prior to communicating with peers over a peer-to-peer network may include a short range discovery process for detecting nearby peers, and a long range discovery process for detecting far away peers. During the long range discovery process, a UE may receive higher energy transmissions, and may therefore need to adjust a gain of at least one receiver to avoid saturating the at least one receiver. In some cases, the gain of the receiver may be adjusted in real-time during the long range discovery process. However, this may require a more complex and/or more expensive receiver. Described herein are methods, systems, apparatuses and/or devices that may predict an AGC setting for long range discovery prior to the long range discovery process, thereby enabling the use of a less complex and/or less expensive receiver.

According to one aspect, a method for predicting an AGC setting for long range discovery in a peer-to-peer network is described. In one configuration, an energy of each resource of a first set of resources may be estimated. A total energy of a second set of resources used for long range discovery in the peer-to-peer network may be predicted. The predicted total energy may be based at least in part on the estimated energy of each resource of the first set of resources. An AGC setting for the second set of resources may be predicted based at least in part on the predicted total energy.

In some examples, estimating the energy of each resource of the first set of resources may include estimating a per-resource energy used for short range discovery in the peer-to-peer network. In some cases, a time period during which resources are used for short range discovery may be less than a time period during which resources are used for long range discovery.

In some examples, a single resource of the first set of resources may be mapped to a plurality of the second set of resources used for long range discovery. The plurality of the second set of resources may in some cases be frequency-multiplexed within one time resource block.

In some examples, the estimated energy of each resource of the first set of resources may be summed, and the total energy of the second set of resources used for long range discovery may be predicted, for a time period, based at least in part on the summed estimated energy of each resource of the first set of resources. In some cases, predicting the total energy of the second set of resources used for long range discovery may include scaling the summed estimated energy.

In some examples, the resources of the first set of resources and the resources of the second set of resources may include time resources and frequency resources that are multiplexed.

In some examples, a gain of at least one receiver used for long range discovery may be adjusted based at least in part on the predicted automatic gain control setting, and after adjusting the gain of the at least one receiver, a transmission may be received over at least one of the second set of resources.

In some examples, one of the first set of resources may be selected, for a future energy transmission, based at least in part on the estimated energy of each resource of the first set of resources.

In some examples, at least one peer in the peer-to-peer network may transmit short range transmissions on at least one of the first set of resources.

In some examples, the number of resources in the first set of resources may be less than the number of resources in the second set of resources.

In some examples, energy may be received via the first set of resources before receiving energy via the second set of resources.

In another aspect, an apparatus for predicting an automatic gain control setting for long range discovery in a peer-to-peer network is also described. In one configuration, the apparatus may include a means for estimating an energy of each resource of a first set of resources; a means for predicting a total energy of a second set of resources used for long range discovery in the peer-to-peer network; and a means for predicting an automatic gain control setting for the second set of resources. The predicted total energy may be based at least in part on the estimated energy of each resource of the first set of resources. The automatic gain control setting may be predicted based at least in part on the predicted total energy. In certain examples, the apparatus may include means for implementing one or more aspects of the functionality described above with reference to the method for predicting an automatic gain control setting for long range discovery in a peer-to-peer network.

In another aspect, an apparatus for predicting an automatic gain control setting for long range discovery in a peer-to-peer network is provided. In some examples, the apparatus may include a processor, memory in electronic communication with the processor, and instructions stored in the memory. The instructions may be executable by the processor to estimate an energy of each resource of a first set of resources; predict a total energy of a second set of resources used for long range discovery in the peer-to-peer network; and predict an automatic gain control setting for the second set of resources. The predicted total energy may be based at least in part on the estimated energy of each resource of the first set of resources. The automatic gain control setting may be predicted based at least in part on the predicted total energy. In certain examples, the instructions may further cause the processor to perform one or more aspects of the functionality described above with reference to the method for predicting an automatic gain control setting for long range discovery in a peer-to-peer network.

In yet another aspect, a computer program product for predicting an automatic gain control setting for long range discovery in a peer-to-peer network is also described. The computer program product may include a non-transitory computer-readable medium storing instructions executable by a processor. The instructions may be executable by the processor to estimate an energy of each resource of a first set of resources; predict a total energy of a second set of resources used for long range discovery in the peer-to-peer network; and predict an automatic gain control setting for the second set of resources. The predicted total energy may be based at least in part on the estimated energy of each resource of the first set of resources. The automatic gain control setting may be predicted based at least in part on the predicted total energy. In certain examples, the instructions may further cause the processor to perform one or more aspects of the functionality described above with reference to the method for predicting an automatic gain control setting for long range discovery in a peer-to-peer network.

Further scope of the applicability of the described methods and apparatuses will become apparent from the following detailed description, claims, and drawings. The detailed description and specific examples are given by way of illustration only, since various changes and modifications within the spirit and scope of the description will become apparent to those skilled in the art.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
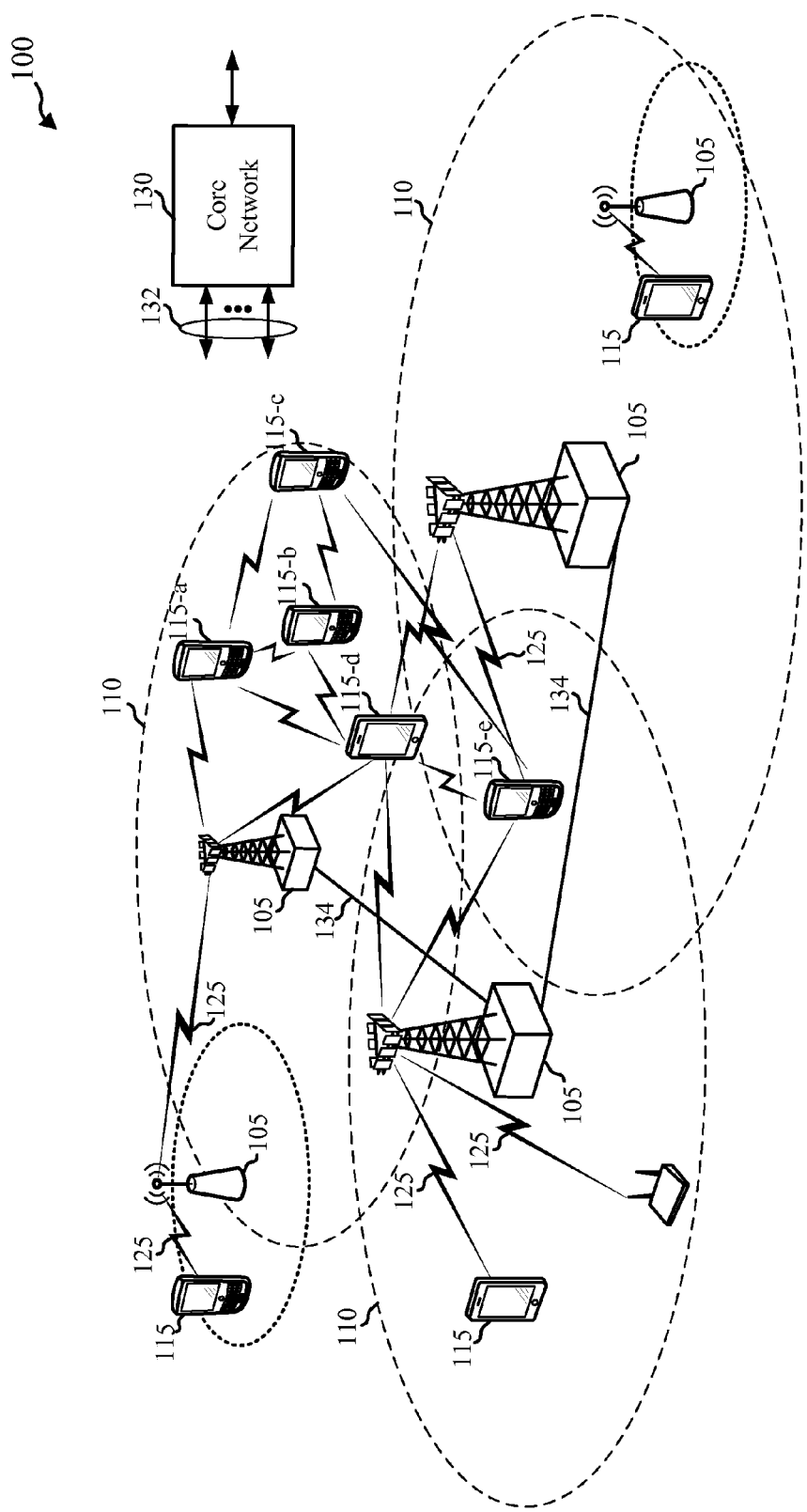
FIG. 1 is a block diagram of an example of a wireless communications system.

The prediction of an automatic gain control (AGC) setting for long range discovery in a peer-to-peer network is described. In particular, methods, systems, apparatuses, and/or devices are described in which transmissions on a first set of resources, such as a set of resources used for short range discovery, are used to predict a total energy of a second set of resources used for long range discovery. The first set of resources may be a small subset of the total number of discovery resources, and may be resources over which lower power transmissions are made, prior to higher power transmissions being made over the second set of resources used for long range discovery.

Peer-to-peer (P2P) networks are ad hoc in nature, wherein peer-to-peer communications are enabled by first detecting the presence of other devices (i.e., peers) at a periodic rate (e.g., every 20 sec). The peers may discover each other without any signaling from a cellular base station. During the discovery process, devices may transmit at a high power (e.g., a power that is not power controlled) to announce their presence. The use of high power allows for the discovery of devices that are located at a considerable distance from one another. However, in a peer-to-peer network that exhibits large variations in distances between peer devices (e.g. from a few centimeters to hundreds of meters) this may translate to significant variations in the received energy at a peer device over time, which in turn may necessitate the use of AGC to adapt device receivers to the variations. Moreover, the variations in the received energy may be non-predictable due to the dynamic nature of the peer-to-peer network, where device peers may be mobile, may be in close proximity, and may join or depart the peer-to-peer network frequently. An AGC algorithm may therefore need to account for unpredictable and large variations in received energy at a device receiver during discovery processes in a peer-to-peer network.

Ideally, a device receiver is able to adapt to changes in received energy with a fast turnaround time (e.g., within a few tens of microseconds for LTE-Direct). The requirement of a fast turnaround time (i.e., fast-AGC), however, may complicate the receiver design as it necessitates a tight coupling between hardware and firmware and may also have hardware implications (e.g., low settling time after gain changes). Thus, having a slow turnaround time may be an attractive option. To meet the contradicting requirement of adapting to the large non-predictable energy variations at a slow rate, the methods, systems, apparatuses, and/or devices described herein use some side information derived during short range discovery to closely predict an AGC setting for long range discovery, thereby eliminating the need for a fast AGC.

The following description provides examples, and is not limiting of the scope, applicability, or configuration set forth in the claims. Changes may be made in the function and arrangement of elements discussed without departing from the spirit and scope of the disclosure. Various examples may omit, substitute, or add various procedures or components as appropriate. For instance, the methods described may be performed in an order different from that described, and various steps may be added, omitted, or combined. Also, features described with respect to certain examples may be combined in other examples.

Referring first to FIG. 1, a diagram illustrates an example of a wireless communications system 100. The wireless communications system 100 includes a plurality of access points (e.g., base stations, eNode Bs (eNBs), or wireless local area network (WLAN) access points) 105, a number of UEs 115, and a core network 130. Some of the access points 105 may communicate with the UEs 115 under the control of a base station controller (not shown), which may be part of the core network 130 or certain access points 105 (e.g., base stations or eNBs) in various examples. Some of the access points 105 may communicate control information and/or user data with the core network 130 through backhaul links 132. In some examples, some of the access points 105 may communicate, either directly or indirectly, with each other over backhaul links 134, which may be wired or wireless communication links. The wireless communications system 100 may support operation on multiple carriers (waveform signals of different frequencies). Multi-carrier transmitters can transmit modulated signals simultaneously on the multiple carriers. For example, each communication link 125 may be a multi-carrier signal modulated according to various radio technologies. Each modulated signal may be sent on a different carrier and may carry control information (e.g., reference signals, control channels, etc.), overhead information, data, etc.

The access points 105 may wirelessly communicate with the UEs 115 via one or more access point antennas. Each of the access points 105 may provide communication coverage for a respective coverage area 110. In some examples, an access point 105 may be referred to as a base station, a base transceiver station, a radio base station, a radio transceiver, a basic service set (BSS), an extended service set (ESS), a NodeB, an evolved NodeB (eNB), a Home NodeB, a Home eNodeB, a WLAN access point, or some other suitable terminology. The coverage area 110 for an access point may be divided into sectors making up only a portion of the coverage area (not shown). The wireless communications system 100 may include access points 105 of different types (e.g., macro, micro, and/or pico base stations). The access points 105 may also utilize different radio technologies. There may be overlapping coverage areas for different types and radio technologies.

In some examples, the wireless communications system 100 may be or include an LTE/LTE-A communications system (or network). In LTE/LTE-A communications systems, the terms evolved Node B (eNB) and user equipment (UE) may be generally used to describe the access points 105 and UEs 115, respectively. The wireless communications system 100 may also be a Heterogeneous LTE/LTE-A network in which different types of eNBs provide coverage for various geographical regions. For example, each eNB 105 may provide communication coverage for a macro cell, a pico cell, a femto cell, and/or other types of cell. A macro cell generally covers a relatively large geographic area (e.g., several kilometers in radius) and may allow unrestricted access by UEs with service subscriptions with the network provider. A pico cell would generally cover a relatively smaller geographic area and may allow unrestricted access by UEs with service subscriptions with the network provider. A femto cell would also generally cover a relatively small geographic area (e.g., a home) and, in addition to unrestricted access, may also provide restricted access by UEs having an association with the femto cell (e.g., UEs in a closed subscriber group (CSG), UEs for users in the home, and the like). An eNB for a macro cell may be referred to as a macro eNB. An eNB for a pico cell may be referred to as a pico eNB. And, an eNB for a femto cell may be referred to as a femto eNB or a home eNB. An eNB may support one or multiple (e.g., two, three, four, and the like) cells.

The core network 130 may communicate with the eNBs 105 via a backhaul links 132 (e.g., S1, etc.). The eNBs 105 may also communicate with one another, e.g., directly or indirectly via backhaul links 134 (e.g., X2, etc.) and/or via backhaul links 132 (e.g., through core network 130). The wireless communications system 100 may support synchronous or asynchronous operation. For synchronous operation, the eNBs may have similar frame timing, and transmissions from different eNBs may be approximately aligned in time. For asynchronous operation, the eNBs may have different frame timing, and transmissions from different eNBs may not be aligned in time. The techniques described herein may be used for either synchronous or asynchronous operations.

The UEs 115 may be dispersed throughout the wireless communications system 100, and each UE may be stationary or mobile. A mobile device or UE 115 may also be referred to by those skilled in the art as a mobile station, a subscriber station, a mobile unit, a subscriber unit, a wireless unit, a remote unit, a wireless device, a wireless communication device, a remote device, a mobile subscriber station, an access terminal, a mobile terminal, a wireless terminal, a remote terminal, a handset, a user agent, a mobile client, a client, or some other suitable terminology. A UE 115 may be a cellular phone, a personal digital assistant (PDA), a wireless modem, a handheld device, a tablet computer, a laptop computer, a cordless phone, a wireless local loop (WLL) station, or the like. A UE may be able to communicate with macro eNBs, pico eNBs, femto eNBs, relays, and the like.

The communication links 125 shown in the wireless communications system 100 may include uplinks for carrying uplink (UL) transmissions (e.g., from a UE 115 to an eNB 105) and/or downlinks for carrying downlink (DL) transmissions (e.g., from an eNB 105 to a UE 115). The UL transmissions may also be called reverse link transmissions, while the DL transmissions may also be called forward link transmissions.

As shown, a UE 115 may in some cases communicate directly with its peers in a peer-to-peer network (e.g., not via an access point 105). For example, the UE 115-*b* is shown to be in communication with UEs 115-*a*, 115-*c*, and 115-*d*. Similarly, the UE 115-*c* is shown to be in communication with UEs 115-*a*, 115-*b*, and 115-*e*. The UE 115-*d* is shown to be in communication with UEs 115-*a*, 115-*b*, and 115-*e*. Because the UEs 115 may be mobile devices, the UEs 115 may periodically engage in a peer discovery process, in which each of the UEs 115 broadcasts one or more peer discovery signals and receives the peer discovery signals of other UEs 115. In some cases, peers (e.g., UEs 115-*a*, 115-*b*, and 115-*c*) may be in close proximity to each other. In other cases, peers (e.g., UEs 115-c and 115-e) may be distant from one another. To account for these differences in proximity, the UEs 115 may engage in a short range discovery process to detect nearby peers, and a long range discovery process to detect far away peers. During the short range discovery process, the UEs 115 may transmit signals at a lower power, to avoid saturating each other's receivers. During the long range discovery process, the UEs 115 may transmit signals at a higher power.

In accord with some examples, a short range discovery process may be conducted over a first set of resources. A UE 115 receiving energy over the first set of resources during a short range discovery process may estimate an energy of each resource of the first set of resources. The first set of resources may in some cases include resources of one or more communication channels in communication with a UE 115. The resources may in some cases be resources used for short range discovery or other short range transmissions in a peer-to-peer network. The UE 115 may use the estimated energy of each resource of the first set of resources to predict a total energy of a second set of resources used for long range discovery in the peer-to-peer network. The UE 115 may then use the predicted total energy of the second set of resources to predict AGC setting.

Figure 2:
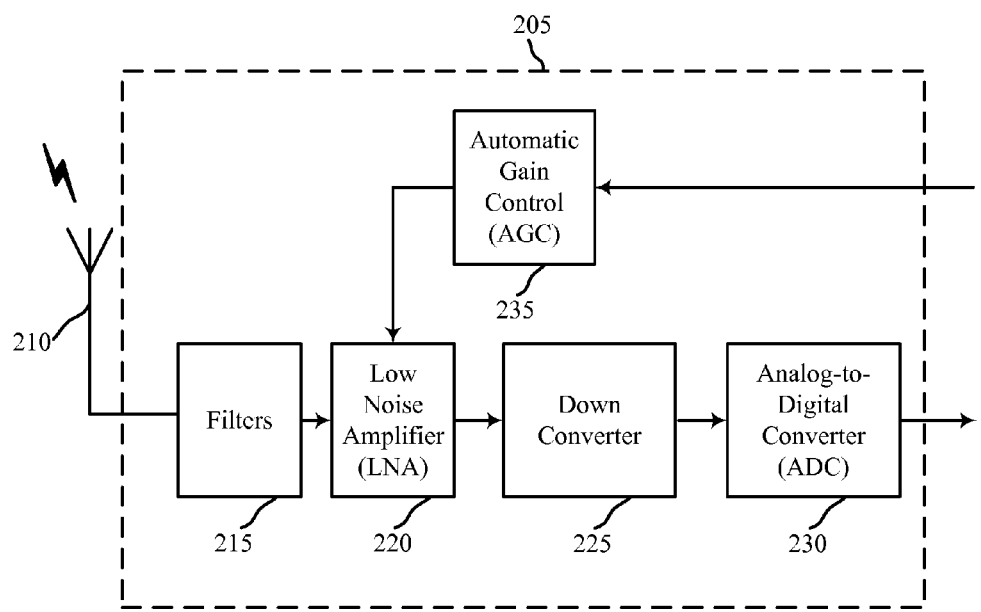
FIG. 2 is a block diagram of an example of a receiver module (e.g., a receiver module of a UE) according to various examples.

FIG. 2 is a block diagram 200 of a receiver module 205. The receiver module 205 may be an example of a receiver module used by one of the UEs 115 described with reference to FIG. 1. The receiver module 205 may include one or more antennas 210, one or more filters 215, a low noise amplifier (LNA) 220, a down converter 225, an analog-to-digital converter (ADC) 230, and/or an automatic gain control (AGC) 235.

Signals received by the antenna(s) 210 may be filtered (e.g., band-pass filtered) by the filter(s) 215 to block signals beyond a frequency or frequencies of interest. The filtered signals may be passed to the LNA 220, which may amplify the filtered signals to an appropriate level for further processing, in accord with a gain adjusted by the AGC 235. The down converter 225 may down convert the amplified signals to a baseband. The ADC 230 may then convert the baseband signals to digital samples.

Figure 3:
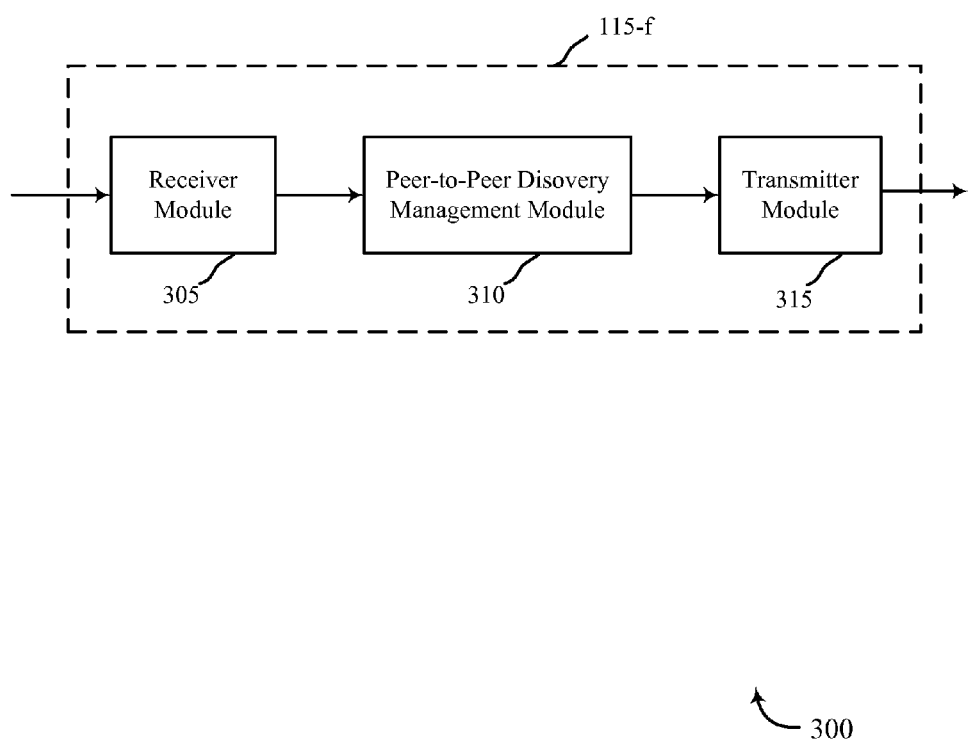
FIG. 3 is a block diagram of an example of a device (e.g., a UE) according to various examples.

Referring now to FIG. 3, a block diagram 300 illustrates a device 115-f for predicting an automatic gain control setting for long range discovery in a peer-to-peer network, in accordance with various examples. The device 115-f may be an example of one or more aspects of one of the UEs 115 described with reference to FIG. 1. The device 115-f may also be a processor. The device 115-f may include a receiver module 305, a peer-to-peer discovery management module 310, and/or a transmitter module 315. Each of these components may be in communication with each other.

The components of the device 115-f may, individually or collectively, be implemented using one or more application-specific integrated circuits (ASICs) adapted to perform some or all of the applicable functions in hardware. Alternatively, the functions may be performed by one or more other processing units (or cores), on one or more integrated circuits. In other examples, other types of integrated circuits may be used (e.g., Structured/Platform ASICs, Field Programmable Gate Arrays (FPGAs), and other Semi-Custom ICs), which may be programmed in any manner known in the art. The functions of each unit may also be implemented, in whole or in part, with instructions embodied in a memory, formatted to be executed by one or more general or application-specific processors.

The receiver module 305 may include any number of receivers. In some cases the receiver module 305 may include a cellular receiver. The cellular receiver may in some cases be an LTE/LTE-A receiver or GSM receiver. The cellular receiver may be used to receive various types of data and/or control signals, collectively referred to as transmissions. The transmissions may be received over one or more communication channels of a wireless communications system, such as the peer-to-peer network of the wireless communications system 100 described with reference to FIG. 1. The signals may in some cases include LTE-Direct signals. The control signals may in some cases include peer discovery signals. In some cases, the receiver module 305 may include an alternate or additional type of receiver, such as a WLAN receiver. The WLAN receiver may also be used to receive various types of data and/or control signals, and may also receive transmissions over one or more communication channels of a wireless communications system, such as the peer-to-peer network of the wireless communications system 100 described with reference to FIG. 1. The receiver module 305 may in some cases include one or more of the receiver module components described with reference to FIG. 2.

The peer-to-peer discovery management module 310 may perform various functions related to the discovery of peers in a peer-to-peer network. In some examples, the peer-to-peer discovery management module 310 may be used to detect the presence of (i.e., discover) other devices operating as its peers in the peer-to-peer network using a short range discovery process and a long range discovery process. The peer-to-peer discovery management module 310 may also predict and adjust gain of a receiver used for long range discovery based on the variations in the received energy observed during the discovery process. In some examples, to account for device mobility within the peer-to-peer network, the peer-to-peer discovery management module 310 may attempt to discover other devices at a periodic rate (e.g., every 20 seconds). The discovery of other devices may in some cases be undertaken without any base station or eNB signaling.

According to some examples, the short range discovery process may be used to discover nearby peers, while the long range discovery process may be used to discover distant peers. During the short range discovery process, the peer-to-peer discovery management module 310 may cause a short range discovery signal (e.g., a beacon signal transmitted at a lower power) to be transmitted from the device 115-f. During the long range discovery process, the peer-to-peer discovery management module 310 may cause a long range discovery signal (e.g., a beacon signal transmitted at a higher power) to be transmitted from the device 115-f. In some examples, the short range discovery process may immediately or closely precedes the long range discovery process.

Because the number of peers and the distances between peers may vary in a peer-to-peer network (e.g., from a few centimeters to hundreds of meters), there may be significant variations in the energy received at a peer device, over time, during discovery processes. These variations are often most significant during the long range discovery process, in which devices transmit peer discovery signals at a higher power (e.g. a maximum power). In contrast, during short range discovery, there is a reduction in both the maximum received power (due to lower transmit power) and the dynamic range in received power (due to interest in a smaller peer discovery radius). To avoid saturation of the receiver module 305, the peer-to-peer discovery management module 310 may adjust the gain of at least one receiver of the receiver module 305 used for the long range discovery.

In some examples, to adjust the gain, the peer-to-peer discovery management module 310 may first estimate an energy of each resource of a first set of resources during the short range discovery. The resources may in some cases include resources of one or more communication channels in communication with the receiver module 305. The resources may in some cases be resources used for short range discovery or other short range transmissions in a peer-to-peer network.

The peer-to-peer discovery management module 310 may then use the estimated energy of each resource of a first set of resources to predict a total energy of a second set of resources used for long range discovery in the peer-to-peer network. In some examples, the predicted total energy may be based at least in part on the estimated energy of each resource of the first set of resources. The resources of the second set of resources may in some cases include resources of one or more communication channels in communication with the receiver module 305.

The peer-to-peer discovery management module 310 may then use the predicted total energy to predict an AGC setting for the second set of resources. In some examples, the AGC setting may be predicted based at least in part on the predicted total energy of the second set of resources. The predicted AGC setting may then be used to adjust the gain of at least one receiver used for long range discovery. The at least one receiver may include at least one receiver of the receiver module 305. After adjusting the gain of the at least one receiver, a transmission may be received at the least one receiver. The transmission may be received over at least one of the second set of resources.

The transmitter module 315 may include any number of transmitters. In some cases the transmitter module 315 may include a cellular transmitter. The cellular transmitter may in some cases be an LTE/LTE-A transmitter or GSM transmitter. The cellular transmitter may be used to transmit various types of data and/or control signals, collectively referred to as transmissions. The transmissions may be made over one or more communication channels of a wireless communications system, such as the peer-to-peer network of the wireless communications system 100 described with reference to FIG. 1. The signals may in some cases include LTE-Direct signals. The control signals may in some cases include peer discovery signals. In some cases, the transmitter module 315 may include an alternate or additional type of transmitter, such as a WLAN transmitter. The WLAN transmitter may also be used to transmit various types of data and/or control signals, and may also make transmissions over one or more communication channels of a wireless communications system, such as the peer-to-peer network of the wireless communications system 100 described with reference to FIG. 1.

Figure 4:
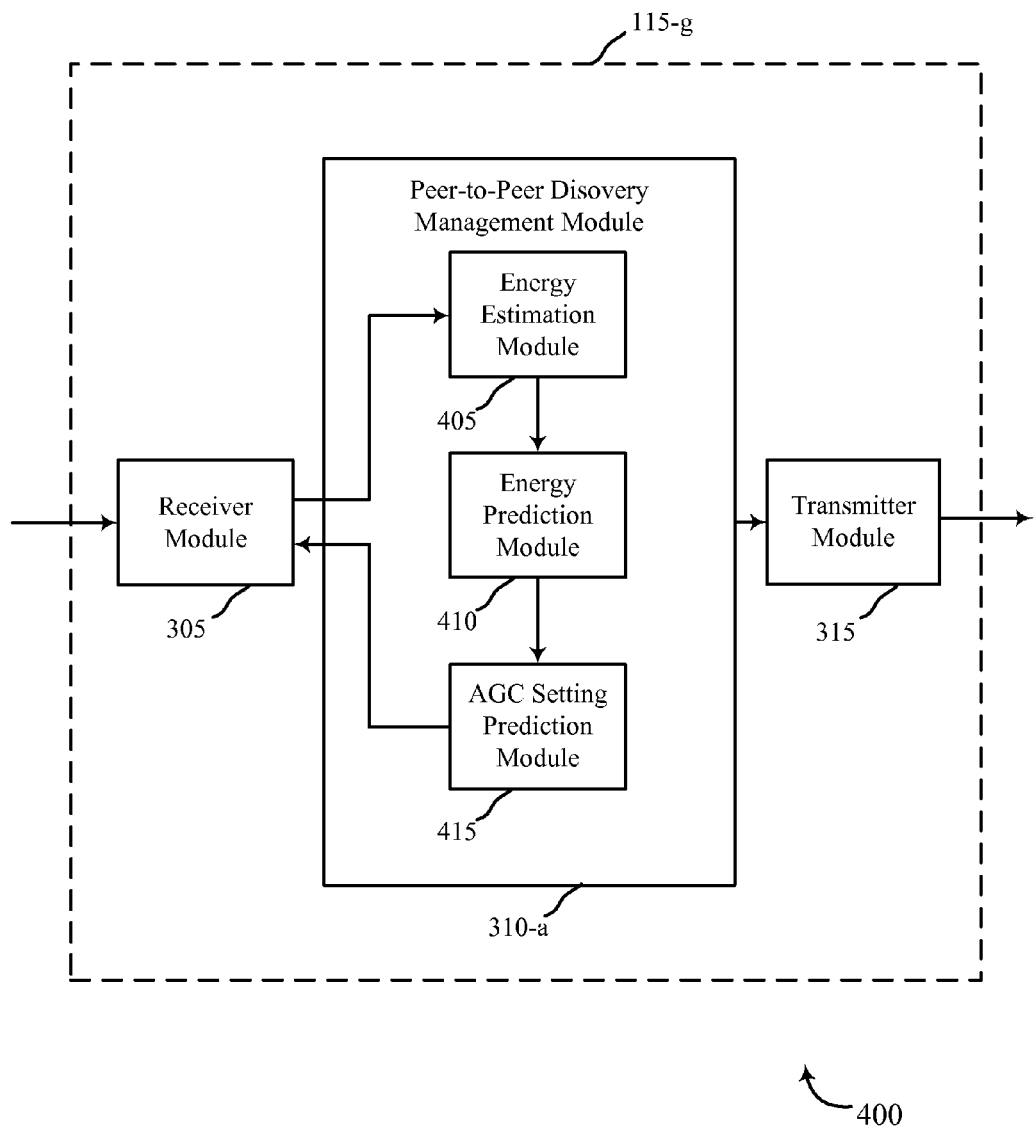
FIG. 4 is a block diagram of another example of a device (e.g., a UE) according to various examples.

Referring now to FIG. 4, a block diagram 400 illustrates another device 115-g for predicting an automatic gain control setting for long range discovery in a peer-to-peer network, in accordance with various examples. The device 115-g may be an example of one or more aspects of one of the UEs 115 described with reference to FIG. 1. The device 115-g may also be a processor. The device 115-g may include a receiver module 305, a peer-to-peer discovery management module 310-a, and/or a transmitter module 315. Each of these components may be in communication with each other.

The components of the device 115-g may, individually or collectively, be implemented using one or more application-specific integrated circuits (ASICs) adapted to perform some or all of the applicable functions in hardware. Alternatively, the functions may be performed by one or more other processing units (or cores), on one or more integrated circuits. In other examples, other types of integrated circuits may be used (e.g., Structured/Platform ASICs, Field Programmable Gate Arrays (FPGAs), and other Semi-Custom ICs), which may be programmed in any manner known in the art. The functions of each unit may also be implemented, in whole or in part, with instructions embodied in a memory, formatted to be executed by one or more general or application-specific processors.

The receiver module 305 and transmitter module 315 may be configured similarly to what is described with reference to FIG. 3. The peer-to-peer discovery management module 310-a may be an example of one or more aspects of the peer-to-peer discovery management module 310 described with reference to FIG. 3 and may include an energy estimation module 405, an energy prediction module 410, and/or an AGC setting prediction module 415.

In some examples, the energy estimation module 405 may estimate an energy of each resource of a first set of resources. The resources may in some cases include resources of one or more communication channels in communication with the receiver module 305, which resources may include time resources and frequency resources that are multiplexed (e.g., time-multiplexed and/or frequency-multiplexed). The resources may in some cases be resources used for short range discovery (e.g., the discovery of other devices or peers) or other short range transmissions in a peer-to-peer network.

In some examples, the energy prediction module 410 may predict a total energy of a second set of resources used for long range discovery in the peer-to-peer network. The predicted total energy may be based at least in part on the estimated energy of each resource of the first set of resources. In some cases, the total energy of a second set of resources may be predicted according the following equation:

$$\sum_{f2} EnergyLong(t2, f2) = \frac{TransmitPowerLog}{TransmitPowerShort} \times \sum_{(t1,f1) \in \Delta(t2)} EnergyShort(t1, f1) \qquad \text{Eq. (1)}$$

where (t1, f1) defines a particular time-frequency resource of the first set of resources; (t2,f2) defines a particular time-frequency resource of the second set of resources; t2 is a time period in which long range discovery is performed; and Δ(t2) is the first set of resources. The EnergyShort may be the energy received per resource of the first set of resources, whereas the sum of the EnergyLong for each frequency f2 may be the predicted total energy of the second set of resources during one time resource block of the second set of resources. The TransmitPowerShort may be a power level at which the UE 115-g and each of its peers transmits energy during the short range discovery process, whereas the TransmitPowerLong may be a power level at which the UE 115-g and each of its peers transmits energy during the long range discovery process.

The resources of the second set of resources may in some cases include resources of one or more communication channels in communication with the receiver module 305, which resources may include time resources and frequency resources that are multiplexed (e.g., time-multiplexed and/or frequency-multiplexed).

In some examples, the AGC setting prediction module 415 may predict an AGC setting for the second set of resources. In some examples, the AGC setting may be based at least in part on the predicted total energy of the second set of resources. The predicted AGC setting may then be used by the peer-to-peer discovery management module 310-*a* to adjust the gain of at least one receiver used for long range discovery. The at least one receiver may include at least one receiver of the receiver module 305. After adjusting the gain of the at least one receiver, a transmission may be received at the least one receiver. The transmission may be received over at least one of the second set of resources.

In some examples, the number of resources in the first set of resources may be less than the number of resources in the second set of resources. In some cases, a single resource of the first set of resources may be mapped to a plurality of the second set of resources used for long range discovery. The plurality of the second set of resources may be frequency-multiplexed within one time resource block.

Figure 5:
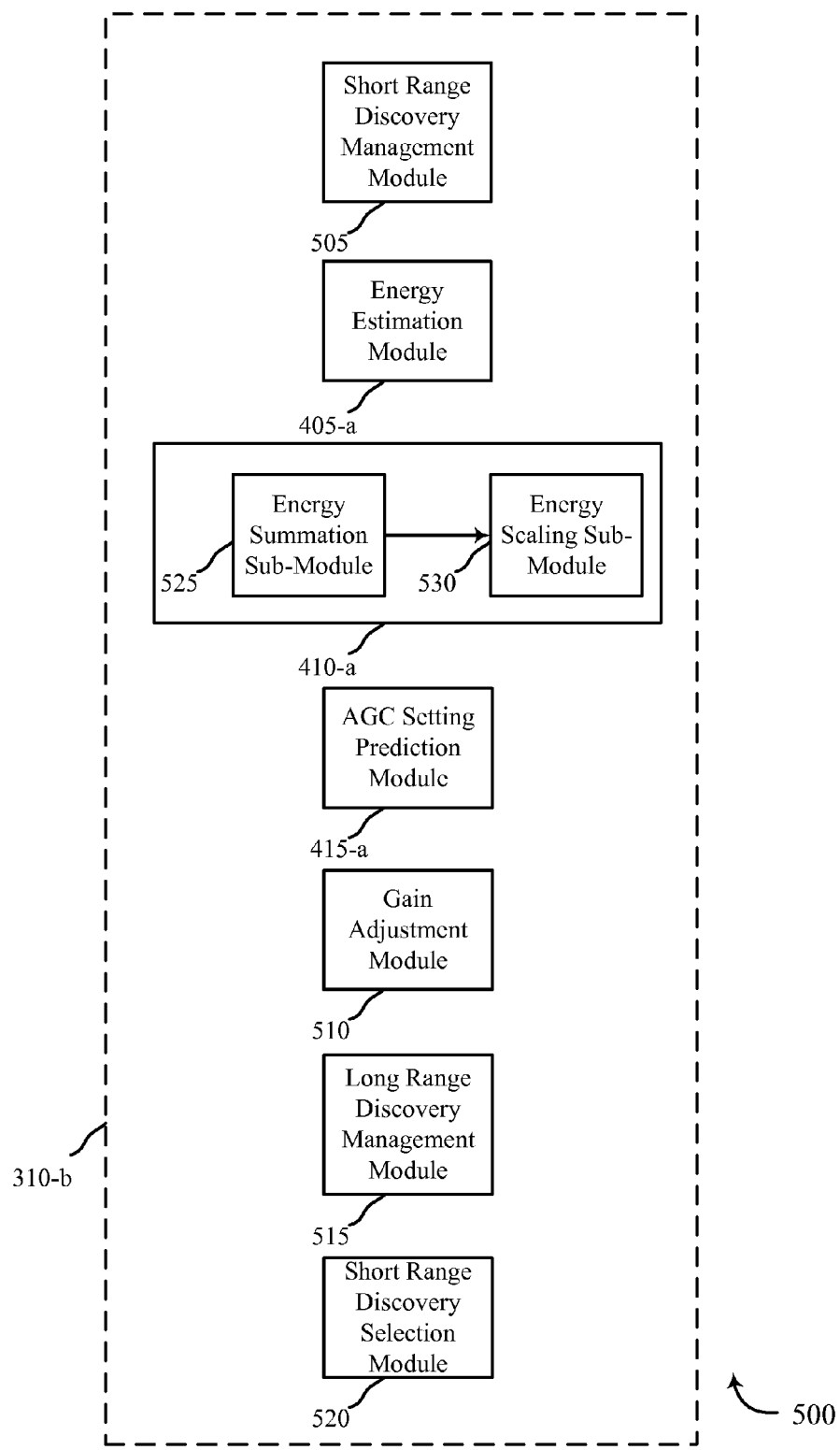
FIG. 5 is a block diagram of an example of a peer-to-peer discovery management module according to various examples.

Referring now to FIG. 5, a block diagram 500 illustrates one example of a peer-to-peer discovery management module 310-*b* in accordance with various examples. The peer-to-peer discovery management module 310-*b* may be an example of one or more aspects of the peer-to-peer discovery management module 310 described with reference to FIGS. 3 and/or 4. The peer-to-peer discovery management module 310-*b* may include a short range discovery management module 505, an energy estimation module 405-*a*, an energy prediction module 410-*a*, an AGC setting prediction module 415-*a*, a gain adjustment module 510, a long range discovery management module 515, and/or a short range discovery resource selection module 520.

The components of the peer-to-peer discovery management module 310-*b* may, individually or collectively, be implemented using one or more ASICs adapted to perform some or all of the applicable functions in hardware. Alternatively, the functions may be performed by one or more other processing units (or cores), on one or more integrated circuits. In other examples, other types of integrated circuits may be used (e.g., Structured/Platform ASICs, FPGAs, and other Semi-Custom ICs), which may be programmed in any manner known in the art. The functions of each unit may also be implemented, in whole or in part, with instructions embodied in a memory, formatted to be executed by one or more general or application-specific processors.

In some examples, the short range discovery management module 505 may be used to manage the transmission and reception of energy on one or more of a first set of resources during a short range discovery process in a peer-to-peer network. The resources may in some cases include resources of one or more communication channels, and may include time resources and/or frequency resources that are multiplexed (e.g., time-multiplexed and/or frequency-multiplexed). The short range discovery management module 505 may in some cases manage the transmission of energy over one of the resources while managing the reception of energy over one or more of the resources. The transmitted energy may be short range energy (e.g., energy on the order of energy used for short range discovery of peers in a peer-to-peer network, which energy is of lower power than energy used for long range discovery of peers).

The energy estimation module 405-*a* may be configured similarly to the energy estimation module 405 described with reference to FIG. 4. For example, the energy estimation module 405 may estimate an energy of each resource of the first set of resources.

The energy prediction module 410-*a* may be an example of one or more aspects of the energy prediction module 410 described with reference to FIG. 4 and may include an energy summation sub-module 525 and/or an energy scaling sub-module 530. The energy prediction module 410-*a* may predict a total energy of a second set of resources used for long range discovery in the peer-to-peer network. The predicted total energy may be based at least in part on the estimated energy of each resource of the first set of resources. In some cases, the predicted total energy may be based on Eq. 1 discussed above. In such a case, the energy summation sub-module 525 may be used to sum the estimated energy of each resource of the first set of resources (e.g., sum the EnergyShort), and the energy scaling sub-module 530 may be used to scale the summed estimated energy of each resource of the first set of resources (e.g., multiply the summed estimated energy by a ratio of the TransmitPowerLong over the TransmitPowerShort, and possibly multiply the summed estimated energy by an additional factor to provide some headroom for fading and mobility). The resources of the second set of resources may in some cases include resources of one or more communication channels in communication with the receiver module 305, which resources may include time resources and frequency resources that are multiplexed (e.g., time-multiplexed and/or frequency-multiplexed).

The AGC setting prediction module 415-*a* may be configured similarly to the AGC setting prediction module 415 described with reference to FIG. 4. For example, the AGC setting prediction module 415 may predict an AGC setting for the second set of resources. The AGC setting may be based at least in part on the predicted total energy of the second set of resources.

In some examples, the gain adjustment module 510 may be used to adjust the gain of at least one receiver used for long range discovery. After adjusting the gain of the at least one receiver, a transmission (e.g., a long range discovery transmission) may be received at the least one receiver. The transmission may be received over at least one of the second set of resources. The gain adjustment module 510 may also be used to adjust the gain of at least one receiver used for receiving short range discovery transmissions and/or energy. However, because of the lower power transmissions during short range discovery, the gain adjustments of the receiver may not be needed and in some cases a static, pre-programmed gain may be used.

In some examples, the long range discovery management module 515 may be used to manage the transmission and reception of energy on one or more of the second set of resources during a long range discovery process in a peer-to-peer network. The long range discovery management module 515 may in some cases manage one or more long range discovery transmissions while also managing one or more long range discovery receptions (e.g., the receipt of long range discovery transmissions of one or more other devices).

In some examples, the short range discovery resource selection module 520 may be used to determine whether an energy transmission made by the short range discovery management module 505 was transmitted on a resource of the first set of resources having an estimated energy lower than another resource of the first set of resources or on the resource having the lowest estimated energy of any of the first set of resources. If it is determined that the energy transmission made by the short range discovery module was transmitted on a resource of the first set of resources having an estimated energy lower than another resource of the first set of resources or on a resource having the lowest estimated energy of any of the first set of resources, the short range discovery resource selection module 520 may not take any further action. Otherwise, the short range discovery resource selection module 520 may select a different one of the first set of resources for a future energy transmission. The different one of the first set of resources may be selected based at least in part on the estimated energy of each resource of the first set of resources. In some cases, the selected resource may be the resource having the lowest estimated energy. In other cases, the selected resource may be a resource having a lower estimated energy than the resource on which short range energy was previously.

The number of resources in the first set of resources may be less than the number of resources in the second set of resources. In some cases, a single resource of the first set of resources may be mapped to a plurality of the second set of resources used for long range discovery. The plurality of the second set of resources may be frequency-multiplexed within one time resource block.

When short range energy is received via the first set of resources before long range energy (e.g., one or more long range discovery transmissions) is received via the second set of resources, and when the short range energy is received close in time or immediately before the long range energy is received, the predicted AGC setting may be very close to an AGC setting that may be computed dynamically, and in real-time, by a more complex and/or more expensive receiver. In some cases, a time period during which resources are used for short range discovery, and in which short range energy may be received, may be less than a time period during which resources are used for long range discovery. The shorter time period during which resources are used for short range discovery may be one of the factors that enables the receipt of long range energy close in time to the receipt of short range energy.

Figure 6:
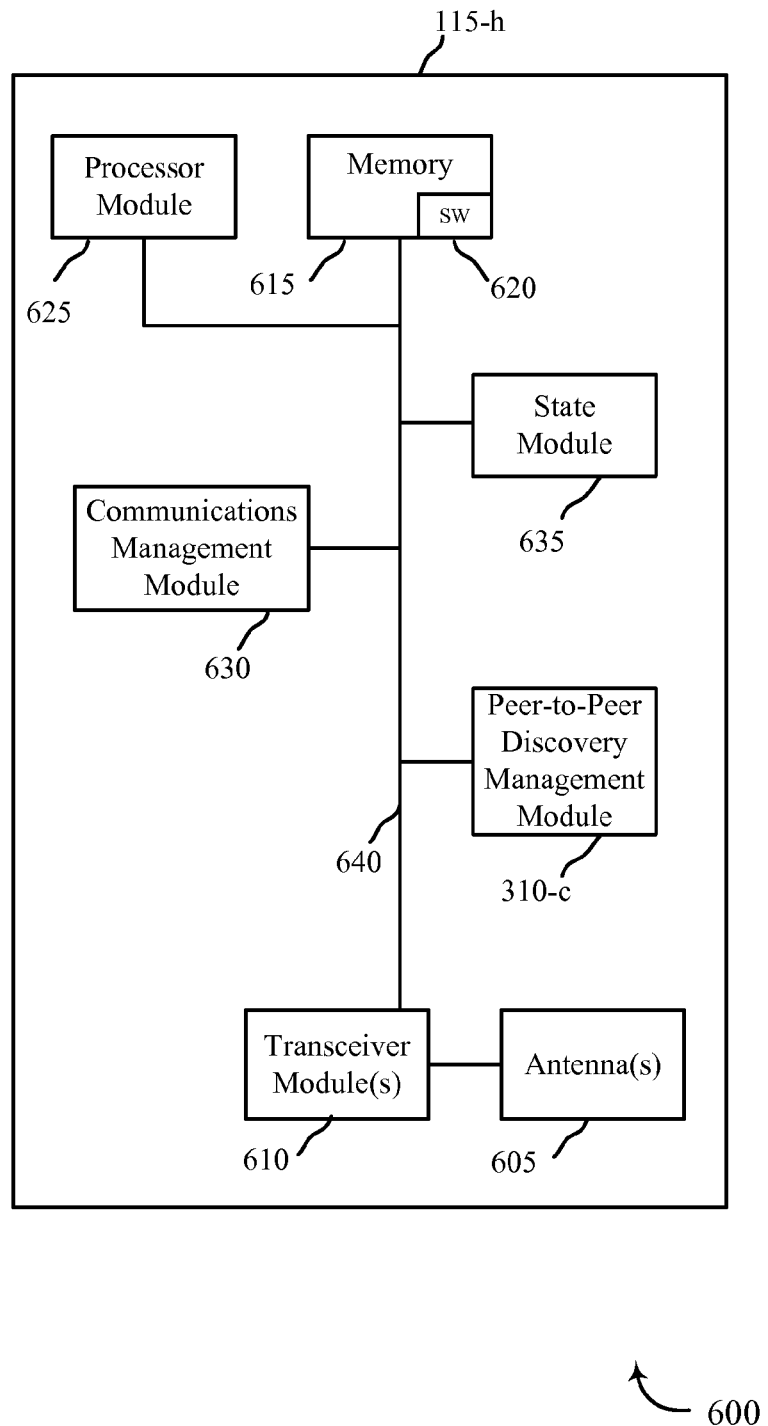
FIG. 6 is a block diagram of an example of a UE according to various examples.

FIG. 6 is an example of a block diagram 600 of a UE 115-h. The UE 115-h may be an example of one or more aspects of the UEs 115 described with reference to FIGS. 1, 3, and/or 4. The UE 115-h may have any of various configurations and may be, or be included as part of, a personal computer (e.g., laptop computer, netbook computer, tablet computer, etc.), a cellular telephone, a PDA, a digital video recorders (DVR), an internet appliance, a gaming console, an e-reader, etc. The UE 115-h may have an internal power supply (not shown), such as a small battery, to facilitate mobile operation.

The UE 115-h may include antenna(s) 605, transceiver module(s) 610, memory 615, and a processor module 625. Each of these components may be in communication, directly or indirectly, with each other (e.g., via one or more buses 640). The transceiver module(s) 610 may be configured to communicate bi-directionally, via the antenna(s) 605 and/or one or more wired or wireless links, with one or more networks. For example, the transceiver module(s) 610 may be configured to communicate bi-directionally with one or more of the access points 105 (e.g., WLAN access points or eNBs) described with reference to FIG. 1. The transceiver module(s) 610 may also be configured to communicate directly with one or more other UEs (e.g., over a peer-to-peer network). The transceiver module(s) 610 may include a modem configured to modulate packets and provide modulated packets to the antenna(s) 605 for transmission, and to demodulate packets received from the antenna(s) 605. While the UE 115-h may include a single antenna, the UE 115-h may typically include multiple antennas for multiple links.

The memory 615 may include random access memory (RAM) and/or read-only memory (ROM). The memory 615 may store computer-readable, computer-executable software (SW) code 620 containing instructions that are configured to, when executed, cause the processor module 625 to perform various functions, including one or more of the functions described herein for predicting an AGC setting for long range discovery in a peer-to-peer network. Alternatively, the software code 620 may not be directly executable by the processor module 625 but may be configured to cause the UE 115-h (e.g., when compiled and executed) to perform one or more of the functions described herein.

The processor module 625 may include an intelligent hardware device, e.g., a CPU, a microcontroller, an ASIC, etc. The processor module 625 may process information received via the antenna(s) 605 and the transceiver module(s) 610, and/or may send information to be transmitted via the transceiver module(s) 610 and the antenna(s) 605. The processor module 625 may handle, alone or in connection with a peer-to-peer discovery management module 310-c, various aspects of predicting an AGC setting for long range discovery in a peer-to-peer network as described herein.

According to the architecture of FIG. 6, the UE 115-h may further include a communications management module 630 and a state module 635. The communications management module 630 may establish and manage communications with access points 105 and/or other UEs 115.

The state module 635 may reflect and control the current device state (e.g., context, authentication, base station association, and/or other connectivity issues).

The peer-to-peer discovery management module 310-c may be an example of one or more aspects of the peer-to-peer discovery management module 310 described with reference to FIGS. 3, 4, and/or 5.

By way of example, each of the communications management module 630, the state module 635, and/or the peer-to-peer discovery management module 310-c may be a component of the UE 115-h in communication with some or all of the other components of the UE 115-h (e.g., via one or more buses 640). Alternatively, functionality of the communications management module 630, the state module 635, and/or the peer-to-peer discovery management module 310-c may be implemented as components of the transceiver module(s) 610, as a computer program product, and/or as one or more controller elements of the processor module 625.

The components of the UE 115-h may, individually or collectively, be implemented with one or more ASICs adapted to perform some or all of the applicable functions in hardware. Alternatively, the functions may be performed by one or more other processing units (or cores), on one or more integrated circuits. In other examples, other types of integrated circuits may be used (e.g., Structured/Platform ASICs, Field Programmable Gate Arrays (FPGAs), and other Semi-Custom ICs), which may be programmed in any manner known in the art. The functions of each unit may also be implemented, in whole or in part, with instructions embodied in a memory, formatted to be executed by one or more general or application-specific processors. Each of the noted modules may be a means for performing one or more functions related to operation of the UE 115-h.

Figure 7:
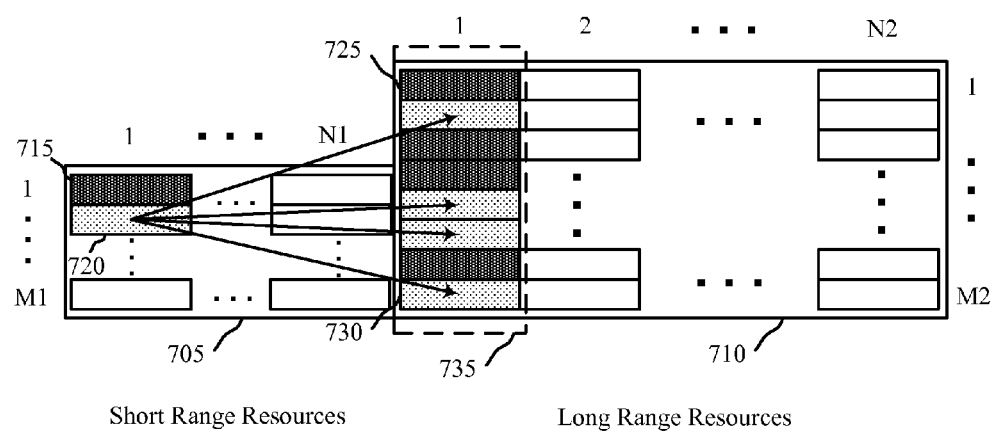
FIG. 7 illustrates an example allocation of resources during a peer discovery process according to various examples.

FIG. 7 illustrates an example allocation of resources 700 during a peer discovery process, such as a peer discovery process engaged in by one of the UEs 115 described with reference to FIGS. 1, 3, 4, and/or 6. The resources 700 include a set of short range resources 705 and a set of long range resources 710. The short range resources 705 include an array of resources that are time-multiplexed among time resource blocks 1 through N1 and frequency-multiplexed among frequency resource blocks 1 through M1. The short range resources may include, for example, resources 715 and 720. The long range resources 710 include an array of resources that are time-multiplexed among time resource blocks 1 through N2 and frequency-multiplexed among frequency resource blocks 1 through M2. The long range resources may include, for example, resources 725 and 730. Each of the time resource blocks may in some cases correspond to the length of a particular subframe (e.g., the length of an LTE subframe).

The number of short range resources 705 may be less than the number of long range resources 710 (e.g., M1×N1<<M2×N2), with the short range resources 705 preceding the long range resources 710. Although the numbers of short range resources 705 and long range resources 710 may be dictated by need, having a fewer number of short range resources 705 also enables all of the short range resources 705 to be relatively closer in time to the long range resources 710, thereby enabling the estimated energy of certain resources within the short range resources 705 to be a good predictor of the total energy of certain groups of resources within the long range resources (e.g., when the estimated energy is close in time to the predicted energy, device mobility is less likely to skew the actual energy of the second set of resources with respect to the predicted energy of the second set of resources).

A first set of resources within the short range resources 705 may include resources 715 and 720. Each of these resources may be mapped to a plurality of resources in a second set of resources 735 including the resources in time resource block 1 of the long range resources 710. For example, resource 720 may be mapped to each of the resources to which it is connected by arrows in FIG. 7. Each of a number of UEs 115 that will be transmitting a long range discovery signal (e.g., long range energy) during one of the resources of the second set of resources 710 should transmit short range energy during the short range resource to which it is mapped, so that its short range energy transmission may be factored into the prediction of the total energy within a time resource block (e.g., the time resource block defined by the second set of resources 735) of the long range resources 710.

Although resources in the second set of resources 735 may map to different short range resources, including short range resources falling within different time and/or frequency resource blocks, a single short range resource may only be mapped to resources within one time resource block of the long range resources 710. This enables a sum of the energy of each resource of the first set of resources to be a prediction of the total energy within one time resource block of the second set of resources.

In addition to using the short range resources 705 for predicting a total energy of a set of long range resources, the short range resources 705 may be used for short range discovery of peers. As long as the number of resources in M1×N1 is considerably larger in comparison to N2 (i.e., the number of time resource blocks represented in the long range resources), the likelihood of two closely located UEs sharing the same short range time-frequency resource for, respectively, short range discovery and the transmission of short range energy, is low. Thus, a short range energy transmission is unlikely to mask the transmission of a short range discovery signal.

Figure 8:
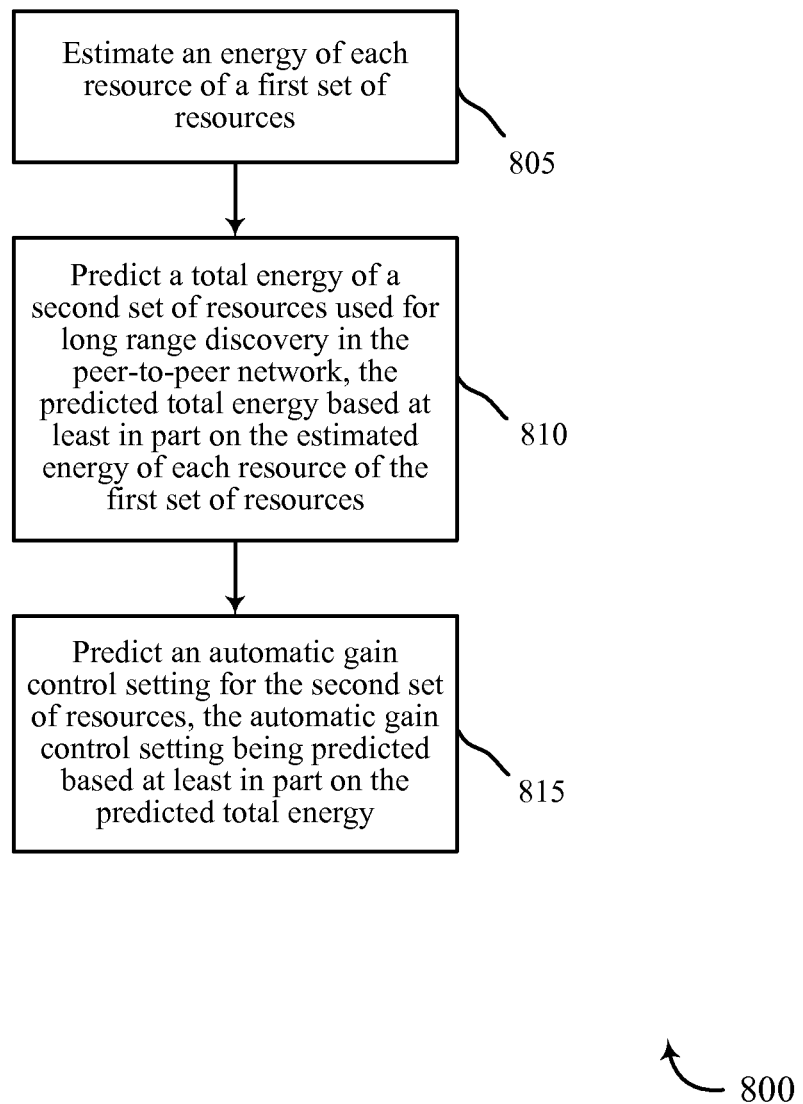
FIGS. 8-10 are flowcharts of example methods for predicting an AGC setting for long range discovery in a peer-to-peer network, according to various examples.

FIG. 8 is a flow chart illustrating an example of a method 800 for predicting AGC setting for long range discovery in a peer-to-peer network. For clarity, the method 800 is described below with reference to one of the UEs 115 described with reference to FIGS. 1, 3, 4, and/or 6, and/or the peer-to-peer discovery management module 310 described with reference to FIGS. 3, 4, and/or 5. In one example, a UE 115 may execute one or more sets of codes to control the functional elements of the UE 115 to perform the functions described below.

At block 805, an energy of each resource of a first set of resources may be estimated. The resources may in some cases include resources of one or more communication channels, which resources may include time resources and frequency resources that are multiplexed (e.g., time-multiplexed and/or frequency-multiplexed). The resources may in some cases be resources used for short range discovery (e.g., the discovery of other devices or peers) or other short range transmissions in a peer-to-peer network. The operation(s) at block 805 may in some cases be performed using the peer-to-peer discovery management module 310 described with reference to FIGS. 3, 4, 5, and/or 6, and/or the energy estimation module 405 described with reference to FIGS. 4 and/or 5.

At block 810, a total energy of a second set of resources used for long range discovery in the peer-to-peer network may be predicted. The predicted total energy may be based at least in part on the estimated energy of each resource of the first set of resources. In some cases, the total energy may be predicted based on Eq. 1 discussed above. The resources of the second set of resources may in some cases include resources of one or more communication channels, which resources may include time resources and frequency resources that are multiplexed (e.g., time-multiplexed and/or frequency-multiplexed). The operation(s) at block 810 may in some cases be performed using the peer-to-peer discovery management module 310 described with reference to FIGS. 3, 4, 5, and/or 6, and/or the energy prediction module 410 described with reference to FIGS. 4 and/or 5

At block 815, an AGC setting for the second set of resources may be predicted. The AGC setting may be predicted based at least in part on the predicted total energy of the second set of resources used for long range discovery. The operation(s) at block 815 may in some cases be performed using the peer-to-peer discovery management module 310 described with reference to FIGS. 3, 4, 5, and/or 6, and/or the AGC setting prediction module 415 described with reference to FIGS. 4 and/or 5.

The number of resources in the first set of resources may be less than the number of resources in the second set of resources. In some cases, a single resource of the first set of resources may be mapped to a plurality of the second set of resources used for long range discovery. The plurality of the second set of resources may be frequency-multiplexed within one time resource block.

Thus, the method 800 may provide for predicting an automatic gain control setting for long range discovery in a peer-to-peer network. It should be noted that the method 800 is just one implementation and that the operations of the method 800 may be rearranged or otherwise modified such that other implementations are possible.

Figure 9:
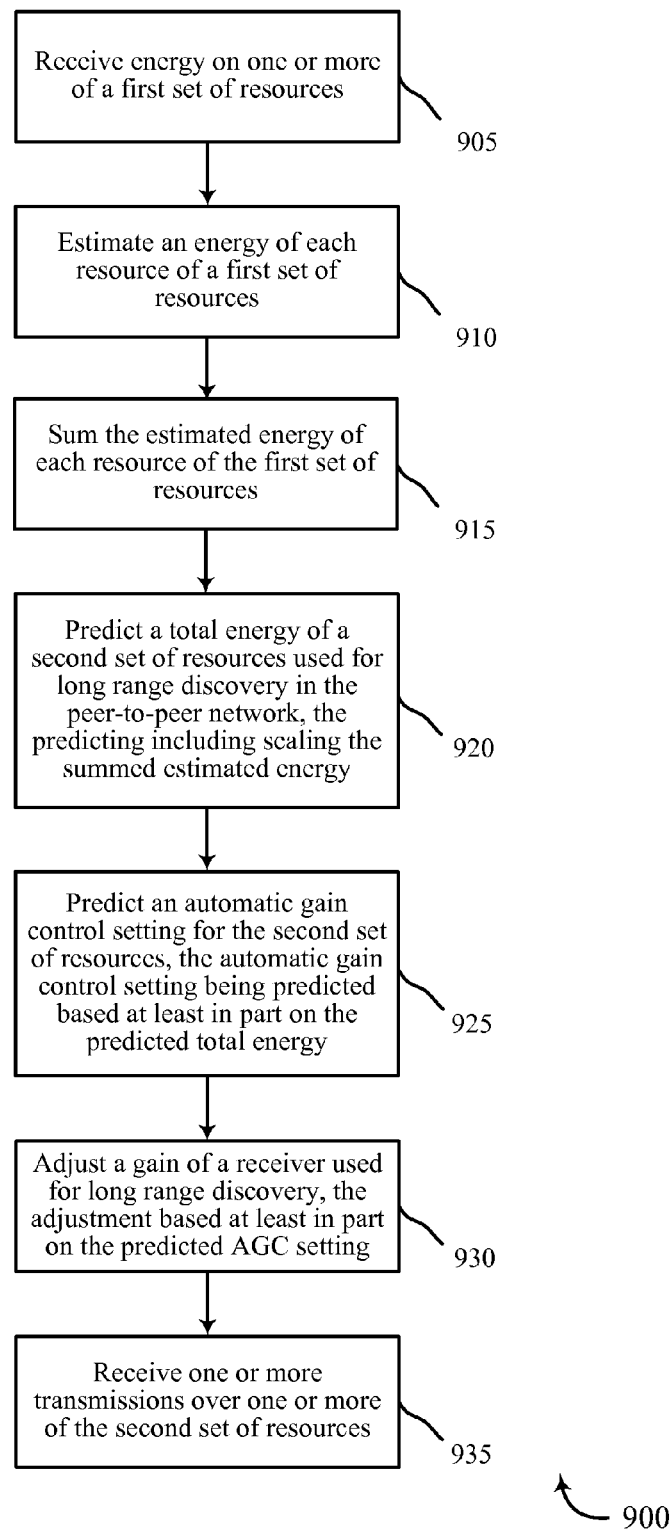

FIG. 9 is a flow chart illustrating an example of a method 900 for predicting an automatic gain control setting for long range discovery in a peer-to-peer network. For clarity, the method 900 is described below with reference to one of the UEs 115 described with reference to FIGS. 1, 3, 4, and/or 6, the receiver module 205 or 305 described with reference to FIGS. 2, 3, and/or 4, the peer-to-peer discovery management module 310 described with reference to FIGS. 3, 4, and/or 5, and/or the transceiver module(s) 610 described with reference to FIG. 6. In one example, a UE 115 may execute one or more sets of codes to control the functional elements of the UE 115 to perform the functions described below.

At block 905, energy may be received on one or more of a first set of resources. The resources may in some cases include resources of one or more communication channels, and may include time resources and/or frequency resources that are multiplexed (e.g., time-multiplexed and/or frequency-multiplexed). The resources may in some cases be resources used for short range discovery (e.g., the discovery of other devices or peers) or other short range transmissions in a peer-to-peer network. The operation(s) at block 905 may in some cases be performed using the receiver module 205 or 305 described with reference to FIGS. 2, 3, and/or 4, and/or the transceiver(s) 610 described with reference to FIG. 6.

At block 910, the energy of each resource of the first set of resources may be estimated. The operation(s) at block 910 may in some cases be performed using the peer-to-peer discovery management module 310 described with reference to FIGS. 3, 4, 5, and/or 6, and/or the energy estimation module 405 described with reference to FIGS. 4 and/or 5.

At block 915, the estimated energy of each resource of the first set of resources may be summed. The operation(s) at block 915 may in some cases be performed using the peer-to-peer discovery management module 310 described with reference to FIGS. 3, 4, 5, and/or 6, and/or the energy prediction module 410 described with reference to FIGS. 4 and/or 5.

At block 920, a total energy of a second set of resources used for long range discovery in the peer-to-peer network may be predicted. The total energy may be predicted, for a time period, based at least in part on the summed estimated energy of each resource of the first set of resources. For example, the total energy may be predicted, at least in part, by scaling the summed estimated energy. In some cases, the total energy may be predicted based on Eq. 1 discussed above. In addition, the summed estimated energy may be scaled to provide some headroom for fading and mobility. The resources of the second set of resources may in some cases include resources of one or more communication channels, which resources may include time resources and frequency resources that are multiplexed (e.g., time-multiplexed and/or frequency-multiplexed). The operation(s) at block 920 may in some cases be performed using the peer-to-peer discovery management module 310 described with reference to FIGS. 3, 4, 5, and/or 6, and/or the energy prediction module 410 described with reference to FIGS. 4 and/or 5

At block 925, an AGC setting for the second set of resources may be predicted. The AGC setting may be predicted based at least in part on the predicted total energy of the second set of resources used for long range discovery. The operation(s) at block 925 may in some cases be performed using the peer-to-peer discovery management module 310 described with reference to FIGS. 3, 4, 5, and/or 6, and/or the AGC setting prediction module 415 described with reference to FIGS. 4 and/or 5.

At block 930, a gain of a receiver used for long range discovery may be adjusted based at least in part on the predicted AGC setting. The operation(s) at block 930 may in some cases be performed using the peer-to-peer discovery management module 310 described with reference to FIGS. 3, 4, 5, and/or 6.

At block 935, and after adjusting the gain of the receiver, one or more transmissions (e.g., long range discovery transmissions of other UEs 115) may be received over one or more of the second set of resources. The operation(s) at block 935 may in some cases be performed using the receiver module 205 or 305 described with reference to FIGS. 2, 3, and/or 4, and/or the transceiver(s) 610 described with reference to FIG. 6.

The number of resources in the first set of resources may be less than the number of resources in the second set of resources. In some cases, a single resource of the first set of resources may be mapped to a plurality of the second set of resources used for long range discovery. The plurality of the second set of resources may be frequency-multiplexed within one time resource block.

When energy is received at block 905, via the first set of resources, before energy (e.g., a transmission) is received at block 935, via the second set of resources, and when the energy received at block 905 is received close in time before the energy received at block 935, the predicted AGC setting may be very close to an AGC setting that may be computed dynamically, and in real-time, by a more complex and/or more expensive receiver. In some cases, a time period during which resources are used for short range discovery, and in which energy may be received at block 905, may be less than a time period during which resources are used for long range discovery at block 935. The shorter time period during which resources are used for short range discovery may be one of the factors that enables the receipt of energy at block 905 close in time to the energy received at block 935.

Thus, the method 900 may provide for predicting an automatic gain control setting for long range discovery in a peer-to-peer network. It should be noted that the method 900 is just one implementation and that the operations of the method 900 may be rearranged or otherwise modified such that other implementations are possible.

Figure 10:
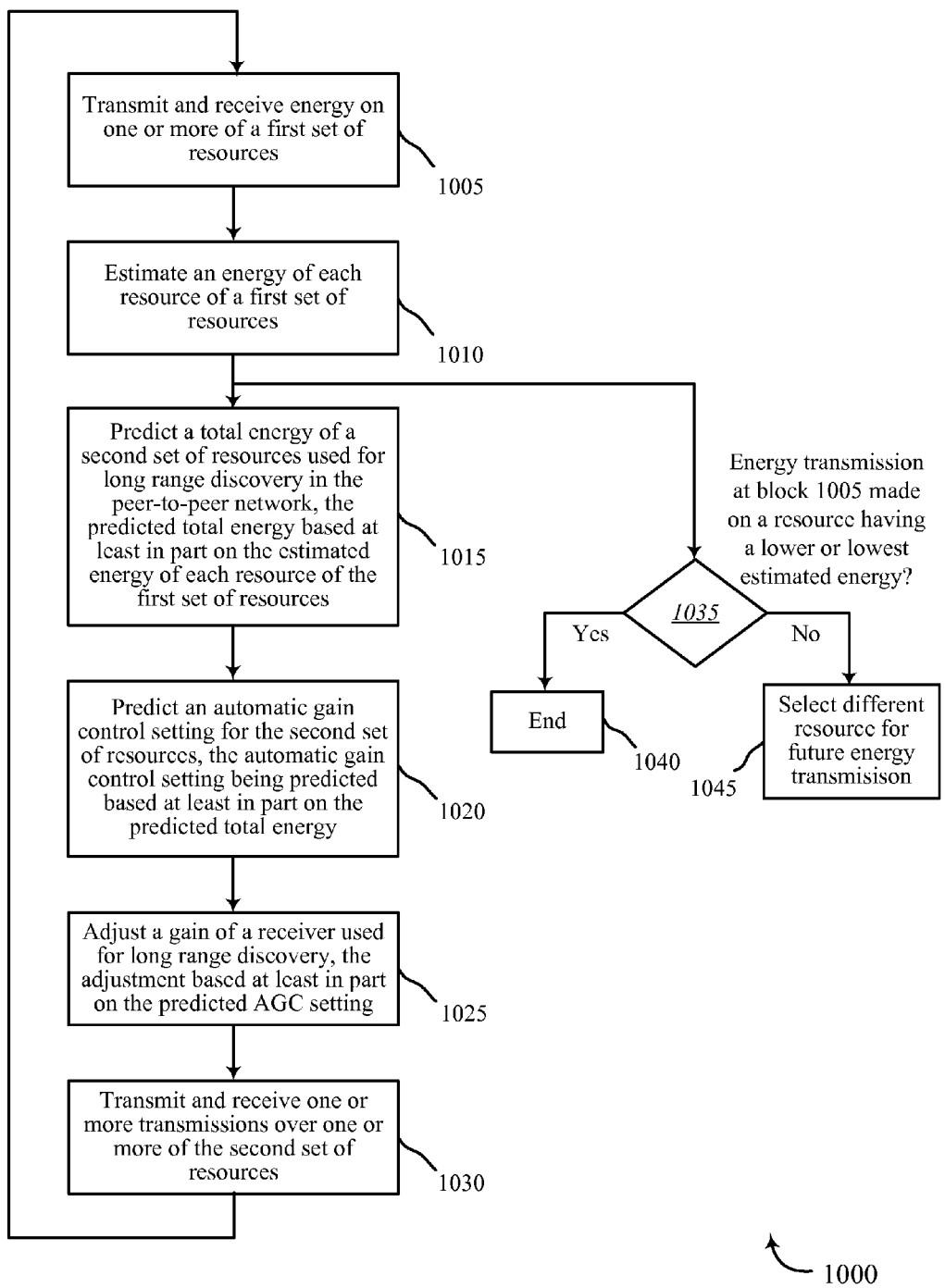

FIG. 10 is a flow chart illustrating an example of a method 1000 for predicting an automatic gain control setting for long range discovery in a peer-to-peer network. For clarity, the method 1000 is described below with reference to one of the UEs 115 described with reference to FIGS. 1, 3, 4, and/or 6, the receiver module 205 or 305 described with reference to FIGS. 2, 3, and/or 4, the peer-to-peer discovery management module 310 described with reference to FIGS. 3, 4, and/or 5, the transmitter module 315 described with reference to FIGS. 3 and/or 4, and/or the transceiver module(s) 610 described with reference to FIG. 6. In one example, a UE 115 may execute one or more sets of codes to control the functional elements of the UE 115 to perform the functions described below.

At block 1005, energy may be transmitted and received on one or more of a first set of resources. The resources may in some cases include resources of one or more communication channels, and may include time resources and/or frequency resources that are multiplexed (e.g., time-multiplexed and/or frequency-multiplexed). The resources may in some cases be resources used for short range discovery (e.g., the discovery of other devices or peers) or other short range transmissions in a peer-to-peer network. Energy may in some cases be transmitted over one of the resources, while energy may be received over one or more of the resources. The transmitted energy may be short range energy (e.g., energy on the order of energy used for short range discovery of peers in a peer-to-peer network, which energy is of lower power than energy used for long range discovery of peers). The transmission operation(s) at block 1005 may in some cases be performed using the transmitter module 315 described with reference to FIG. 3, and/or the transceiver module(s) 610 described with reference to FIG. 6. The reception operation(s) at block 1005 may in some cases be performed using the receiver module 205 or 305 described with reference to FIGS. 2, 3, and/or 4, and/or the transceiver(s) 610 described with reference to FIG. 6.

At block 1010, the energy of each resource of the first set of resources may be estimated. The operation(s) at block 1010 may in some cases be performed using the peer-to-peer discovery management module 310 described with reference to FIGS. 3, 4, 5, and/or 6, and/or the energy estimation module 405 described with reference to FIGS. 4 and/or 5.

At block 1015, a total energy of a second set of resources used for long range discovery in the peer-to-peer network may be predicted. The predicted total energy may be based at least in part on the estimated energy of each resource of the first set of resources. In some cases, the predicted total energy may be based on Eq. 1. The resources of the second set of resources may in some cases include resources of one or more communication channels, which resources may include time resources and frequency resources that are multiplexed (e.g., time-multiplexed and/or frequency-multiplexed). The operation(s) at block 1015 may in some cases be performed using the peer-to-peer discovery management module 310 described with reference to FIGS. 3, 4, 5, and/or 6, and/or the energy prediction module 410 described with reference to FIGS. 4 and/or 5.

At block 1020, an AGC setting for the second set of resources may be predicted. The AGC setting may be predicted based at least in part on the predicted total energy of the second set of resources used for long range discovery. The operation(s) at block 1020 may in some cases be performed using the peer-to-peer discovery management module 310 described with reference to FIGS. 3, 4, 5, and/or 6, and/or the AGC setting prediction module 415 described with reference to FIGS. 4 and/or 5.

At block 1025, a gain of a receiver used for long range discovery may be adjusted based at least in part on the predicted AGC setting. The operation(s) at block 1025 may in some cases be performed using the peer-to-peer discovery management module 310 described with reference to FIGS. 3, 4, 5, and/or 6.

At block 1030, and after adjusting the gain of the receiver, one or more transmissions (e.g., long range discovery transmissions) may be made while one or more other transmissions (e.g., long range discovery transmissions of one or more other UEs 115) may be received. The transmission operation(s) at block 1030 may in some cases be performed using the transmitter module 315 described with reference to FIG. 3, and/or the transceiver module(s) 610 described with reference to FIG. 6. The reception operation(s) at block 1030 may in some cases be performed using the receiver module 205 or 305 described with reference to FIGS. 2, 3, and/or 4, and/or the transceiver(s) 610 described with reference to FIG. 6.

Following the operation(s) at block 1030, and possibly after a delay, the method 1000 may loop back to block 1005 and repeat the operations of blocks 1005-1030. However, in addition to the flow defined by blocks 1005-1030, an additional flow may be defined by blocks 1005, 1010, 1035, 1040, and/or 1045. The additional flow may be executed before, during, or after the flow defined by blocks 1005-1030. In the additional flow, it may be determined at block 1035, after estimating the energy of each resource of the first set of resources at block 1005, whether the energy transmission made at block 1005 was transmitted on a resource of the first set of resources having a lower estimated energy than another resource of the first set of resources or on the resource having the lowest estimated energy of any of the first set of resources. If so, the additional flow may end at block 1040. If not, the additional flow may proceed to block 1045, where a different one of the first set of resources may be selected for a future energy transmission. The different one of the first set of resources may be selected based at least in part on the estimated energy of each resource of the first set of resources. In some cases, the selected resource may be the resource having the lowest estimated energy. In other cases, the selected resource may be a resource having a lower estimated energy than the resource on which energy was previously transmitted at block 1005.

The number of resources in the first set of resources may be less than the number of resources in the second set of resources. In some cases, a single resource of the first set of resources may be mapped to a plurality of the second set of resources used for long range discovery. The plurality of the second set of resources may be frequency-multiplexed within one time resource block.

When energy is received at block 1005, via the first set of resources, before energy (e.g., a transmission) is received at block 1030, via the second set of resources, and when the energy received at block 1005 is received close in time before the energy received at block 1030, the predicted AGC setting may be very close to an AGC setting that may be computed dynamically, and in real-time, by a more complex and/or more expensive receiver. In some cases, a time period during which resources are used for short range discovery, and in which energy may be received at block 1005, may be less than a time period during which resources are used for long range discovery at block 1030. The shorter time period during which resources are used for short range discovery may be one of the factors that enables the receipt of energy at block 1005 close in time to the energy received at block 1030.

Thus, the method 1000 may provide for predicting an automatic gain control setting for long range discovery in a peer-to-peer network. It should be noted that the method 1000 is just one implementation and that the operations of the method 1000 may be rearranged or otherwise modified such that other implementations are possible.

The detailed description set forth above in connection with the appended drawings describes exemplary examples and does not represent the only examples that may be implemented or that are within the scope of the claims. The term "exemplary" used throughout this description means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

Techniques described herein may be used for various wireless communications systems such as CDMA, TDMA, FDMA, OFDMA, SC-FDMA, and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases 0 and A are commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM). An OFDMA system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM, etc. UTRA and E-UTRA are part of Universal Mobile Telecommunication System (UMTS). 3GPP Long Term Evolution (LTE) and LTE-Advanced (LTE-A) are new releases of UMTS that use E-UTRA. UTRA, E-UTRA, UMTS. LTE, LTE-A, and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. The description below, however, describes an LTE system for purposes of example, and LTE terminology is used in much of the description below, although the techniques are applicable beyond LTE applications.

The communication networks that may accommodate some of the various disclosed examples may be packet-based networks that operate according to a layered protocol stack. For example, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use Hybrid ARQ (HARQ) to provide retransmission at the MAC layer to improve link efficiency. At the Physical layer, the transport channels may be mapped to Physical channels.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration. A processor may in some cases be in electronic communication with a memory, where the memory stores instructions that are executable by the processor.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

A computer program product or computer-readable medium both include a computer-readable storage medium and communication medium, including any mediums that facilitates transfer of a computer program from one place to another. A storage medium may be any medium that can be accessed by a general purpose or special purpose computer. By way of example, and not limitation, computer-readable medium can comprise RAM, ROM, EEPROM, CD-ROM or other optical disk storage, magnetic disk storage or other magnetic storage devices, or any other medium that can be used to carry or store desired computer-readable program code in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote light source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the spirit or scope of the disclosure. Throughout this disclosure the term "example" or "exemplary" indicates an example or instance and does not imply or require any preference for the noted example. Thus, the disclosure is not to be limited to the examples and designs described herein but is to be accorded the widest scope consistent with the principles and novel features disclosed herein.

What is claimed is:

1. A method for predicting an automatic gain control setting for long range discovery in a peer-to-peer network, comprising:

receiving a short range discovery signal on a first set of resources used for a short range discovery process in the peer-to-peer network estimating an energy within each resource of the first set of resources;

predicting an automatic gain control setting for a second set of resources used for a long range discovery process in the peer-to-peer network, the automatic gain control setting being predicted based at least in part on a predicted total energy, wherein the long range discovery process uses long range discovery signals transmitted at a higher power level than the short range discovery process, and wherein the predicted total energy is based at least in part on the estimated energy within each resource of the first set of resources; and receiving, after receiving the short range discovery signal, a long range discovery signal on the second set of resources using the predicated automatic gain control setting, wherein a number of resources in the first set of resources is less than a number of resources in the second set of resources.

2. The method of claim 1, wherein a time period during which resources are used for the short range discovery process is less than a time period during which resources are used for the long range discovery process.

3. The method of claim 1, wherein a single resource of the first set of resources is mapped to a plurality of the second set of resources used for the long range discovery process.

4. The method of claim 3, wherein the plurality of the second set of resources is frequency-multiplexed within one time resource block.

5. The method of claim 1, further comprising:
summing the estimated energy of each resource of the first set of resources; and
predicting the total energy of the second set of resources used for the long range discovery process, for a time period, based at least in part on the summed estimated energy of each resource of the first set of resources.

6. The method of claim 5, wherein predicting the total energy of the second set of resources used for the long range discovery process comprises:
scaling the summed estimated energy.

7. The method of claim 1, wherein the resources of the first set of resources and the resources of the second set of resources comprise time resources and frequency resources that are multiplexed.

8. The method of claim 1, further comprising:
adjusting a gain of at least one receiver used for the long range discovery process based at least in part on the predicted automatic gain control setting; and
after adjusting the gain of the at least one receiver, receiving a transmission over at least one of the second set of resources.

9. The method of claim 1, further comprising:
selecting one of the first set of resources, for a future energy transmission, based at least in part on the estimated energy of each resource of the first set of resources.

10. The method of claim 1, wherein at least one peer in the peer-to-peer network transmits short range transmissions on at least one of the first set of resources.

11. The method of claim 1, further comprising:
receiving energy via the first set of resources before receiving energy via the second set of resources.

12. An apparatus for predicting an automatic gain control setting for long range discovery in a peer-to-peer network, comprising:
means for receiving a short range discovery signal on a first set of resources used for a short range discovery process in the peer-to-peer network
means for estimating an energy within each resource of the first set of resources;
means for predicting an automatic gain control setting for a second set of resources used for a long range discovery process in the peer-to-peer network, the automatic gain control setting being predicted based at least in part on a predicted total energy, wherein the long range discovery process uses long range discovery signals transmitted at a higher power level than the short range discovery process, and wherein the predicted total energy is based at least in part on the estimated energy within each resource of the first set of resources; and means for receiving, after receiving the short range discovery signal, a long range discovery signal on the second set of resources using the predicated automatic gain control setting, wherein a number of resources in the first set of resources is less than a number of resources in the second set of resources.

13. The apparatus of claim 12, wherein a time period during which resources are used for the short range discovery process is less than a time period during which resources are used for the long range discovery process.

14. The apparatus of claim 12, wherein a single resource of the first set of resources is mapped to a plurality of the second set of resources used for the long range discovery process.

15. The apparatus of claim 14, wherein the plurality of the second set of resources is frequency-multiplexed within one time resource block.

16. The apparatus of claim 12, further comprising:
means for summing the estimated energy of each resource of the first set of resources; and
means for predicting the total energy of the second set of resources used for the long range discovery process, for a time period, based at least in part on the summed estimated energy of each resource of the first set of resources.

17. The apparatus of claim 16, wherein the means for predicting the total energy of the second set of resources used for the long range discovery process comprises:
means for scaling the summed estimated energy.

18. The apparatus of claim 12, wherein the resources of the first set of resources and the resources of the second set of resources comprise time resources and frequency resources that are multiplexed.

19. The apparatus of claim 12, further comprising:
means for adjusting a gain of at least one receiver used for the long range discovery process based at least in part on the predicted automatic gain control setting; and
means for after adjusting the gain of the at least one receiver, receiving a transmission over at least one of the second set of resources.

20. The apparatus of claim 12, further comprising:
means for selecting one of the first set of resources, for a future energy transmission, based at least in part on the estimated energy of each resource of the first set of resources.

21. The apparatus of claim 12, wherein at least one peer in the peer-to-peer network transmits short range transmissions on at least one of the first set of resources.

22. The apparatus of claim 12, further comprising:
means for receiving energy via the first set of resources before receiving energy via the second set of resources.

23. The apparatus of claim 22, wherein a single resource of the first set of resources is mapped to a plurality of the second set of resources used for the long range discovery process.

24. An apparatus for predicting an automatic gain control setting for long range discovery in a peer-to-peer network, comprising:
a processor;
memory in electronic communication with the processor; and
instructions stored in the memory, the instructions being executable by the processor to:

receive a short range discovery signal on a first set of resources used for a short range discovery process in the peer-to-peer network estimate an energy within each resource of the first set of resources;

predict an automatic gain control setting for a second set of resources used for a long range discovery process in the peer-to-peer network, the automatic gain control setting being predicted based at least in part on a predicted total energy, wherein the long range discovery process uses long range discovery signals transmitted at a higher power level than the short range discovery process, and wherein the predicted total energy is based at least in part on the estimated energy within each resource of the first set of resources; and receive, after receiving the short range discovery signal, a long range discovery signal on the second set of resources using the predicated automatic gain control setting, wherein a number of resources in the first set of resources is less than a number of resources in the second set of resources.

25. A non-transitory computer-readable medium storing computer-executable code for wireless communication, the code executable by a processor to:

receive a short range discovery signal on a first set of resources used for a short range discovery process in the peer-to-peer network estimate an energy within each resource of the first set of resources;

predict an automatic gain control setting for a second set of resources used for a long range discovery process in the peer-to-peer network, the automatic gain control setting being predicted based at least in part on a predicted total energy, wherein the long range discovery process uses long range discovery signals transmitted at a higher power level than the short range discovery process, and wherein the predicted total energy is based at least in part on the estimated energy within each resource of the first set of resources; and receive, after receiving the short range discovery signal, a long range discovery signal on the second set of resources using the predicated automatic gain control setting, wherein a number of resources in the first set of resources is less than a number of resources in the second set of resources.

* * * * *